(12) United States Patent
Ferrucci et al.

(10) Patent No.: US 9,570,134 B1
(45) Date of Patent: Feb. 14, 2017

(54) REDUCING TRANSACTIONAL LATENCY IN ADDRESS DECODING

(71) Applicant: Altera Corporation, San Jose, CA (US)

(72) Inventors: Aaron Ferrucci, Santa Cruz, CA (US); Jimmy Soon Yoong Yeap, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/087,791

(22) Filed: Mar. 31, 2016

(51) Int. Cl.
  *G11C 8/00* (2006.01)
  *G11C 8/10* (2006.01)
  *G06F 9/30* (2006.01)

(52) U.S. Cl.
  CPC ............ *G11C 8/10* (2013.01); *G06F 9/30145* (2013.01); *G06F 9/3016* (2013.01)

(58) Field of Classification Search
  CPC ........... G11C 8/08; G11C 8/10; G11C 11/418; G11C 29/024; G11C 11/4087; G06F 9/30145; G06F 9/30149; G06F 9/3016; G06F 9/30167

USPC ... 365/230.06, 230.03, 230.01; 712/208–212
See application file for complete search history.

(56) References Cited

U.S. PATENT DOCUMENTS

| 5,546,353 | A | 8/1996 | Phillips et al. |
| 6,067,603 | A | 5/2000 | Carpenter et al. |
| 8,291,202 | B2 | 10/2012 | Streett et al. |
| 8,599,640 | B2 * | 12/2013 | Hung ............... G11C 8/12 365/230.01 |
| 2013/0046961 | A1 | 2/2013 | Rabinovitch et al. |
| 2014/0181459 | A1 | 6/2014 | Venkumahanti et al. |

* cited by examiner

*Primary Examiner* — David Lam

(57) ABSTRACT

Techniques for reducing latency in address decoding are described. According to one approach, a method of operating an addressing circuit comprises partitioning range of encoded addresses into a first and second subset of encoded addresses, sending a first encoded address to a address decode circuit from a controller. In response to determining that the first encoded address is contained in the first subset, decoding the first encoded address in a first duration. In response to determining that the first encoded address is contained in the second subset, decoding the first encoded address in a second duration which is longer than the first duration and simultaneously sending a halt signal to the controller to stop sending subsequent encoded addresses for decoding for the entirety of the second duration.

20 Claims, 6 Drawing Sheets

REDUCING TRANSACTIONAL LATENCY IN ADDRESS DECODING

BACKGROUND

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section.

The present disclosure generally relates to integrated circuits and more specifically relates to reducing transactional latency in address decoding.

Address decoding circuits are used in many integrated circuits, especially those relying on buses for example, microprocessors, FPGAs, and ASICS. Address decoding circuits typically contain digital logic that implements the address decode function.

An address decoding circuit in a computing system generates a chipselect signal for a target device upon receiving a request (an address decoding transaction) from a controller to access that target device. Examples of target devices or target circuits may include input/output devices, memory components, and connection components. A controller circuit controls the flow of data going to and from a computing system's main memory and other target devices.

An address decoding transaction comprises a controller sending requests (which may include memory-mapped or encoded addresses) to an address decoding circuit to read data from or write data to a target device. The encoded address is used by processing circuitry (for example, a central processing unit) to communicate with a controller. However, it is the address decoding circuit that then implements the address decoding function to generate a chipselect signal for the target device and forwards the results of the decoding to a selecting circuit, for example a de-multiplexer circuit. The selecting circuit then forwards the instructions from the controller to the appropriate target device.

In many systems, addresses are decoded in a single clock cycle. However, in more complicated computing systems, such as FPGAs that employ an interconnect architecture, use larger address widths, or interface with more addressable target circuits, address decoding is more complex and may become a critical path for the operation of the circuit. Therefore, there is a need for mitigating or eliminating the additional latency, while allowing a high operating frequency for address decoding transactions.

SUMMARY

Embodiments described herein include methods of initializing a memory device and an initialization apparatus. It should be appreciated that the embodiments can be implemented in numerous ways, such as a process, an apparatus, a system, a device, or a method. Several embodiments are described below.

In one embodiment, a method of operating an addressing circuit is disclosed. The addressing circuit is coupled to a controller circuit and a target circuit with a target address. The method may include an operation to partition a range of encoded addresses into a first subset and a second subset of encoded addresses using an address partitioning circuit. The method may also include an operation to receive, using an address decoding circuit, the first encoded address from the controller. The method may further include an operation to determine whether the first or the second subset contains the first encoded address using the address decoding circuit. In response to determining that the first encoded address belongs to the first subset of encoded addresses, the method may include an operation to decode the first encoded address in a first duration using the address decoding circuit. In response to determining that the first encoded address belongs to the second subset of encoded addresses the method may include an operation to decode the first encoded address in a second duration using the address decoding circuit, wherein the second duration is longer than the first duration. The method may include another operation to send, using the address decoding circuit, a wait signal to the controller, wherein the wait signal halts the controller from sending a second encoded address of the range of encoded addresses until the first encoded address is decoded.

In another embodiment, a method of partitioning a range of encoded addresses is disclosed. The partitioning circuit may be coupled to and controlled by the controller or the address decoding circuit. The method may include an operation to select a pre-determined partition model from a set of pre-determined partition models. The method may also include an operation to divide, using the address partitioning circuit, the range of encoded addresses into the first and the second subsets of encoded addresses according to the pre-determined partition model.

In another embodiment, a method of operating an addressing circuit is disclosed. The addressing circuit is coupled to a controller circuit and a target circuit with a target address. The method may include an operation to receive, using an address decoding circuit, the first encoded address from the controller. The method may include an operation to generate a select-all signal using a pipelining circuit, wherein the select-all circuit selects all targets associated with a selecting circuit. The method may also include an operation to evaluate, using the address decoding circuit, a cancel signal, wherein the cancel signal is evaluated in parallel with generating a select-all signal. The method may further include an operation to send the select-all signal and the cancel signal to a selecting circuit. This method may include an operation to determine a first target address based on the select-all signal and the cancel signal using the selecting circuit. The method may further include an operation to access a first target circuit associated with the first target address using the selecting circuit.

In an embodiment, the cancel signal modifies the select-all signal to select one target of the set of targets that are accessible using the selecting circuit.

Further features of the invention, its nature and various advantages will be more apparent from the accompanying drawings and the following detailed description of the preferred embodiments.

DETAILED DESCRIPTION

Embodiments of the present invention relate to integrated circuits with logic circuitry. The integrated circuits may be any suitable type of integrated circuit, such as microprocessors, application-specific integrated circuits, digital signal processors, memory circuits, or other integrated circuits. If desired, the integrated circuits may be programmable integrated circuits that contain programmable logic circuitry. The present invention will generally be described in the context of integrated circuits such as programmable logic device (PLD) integrated circuits as an example. In the following description, the terms 'circuitry' and 'circuit' are used interchangeably.

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Several features are described hereafter that can each be used independently of one another or with any combination of other features. However, any individual feature may not address any of the problems discussed above or might only address one of the problems discussed above. Some of the problems discussed above may not be fully addressed by any of the features described herein.

Figure 1:
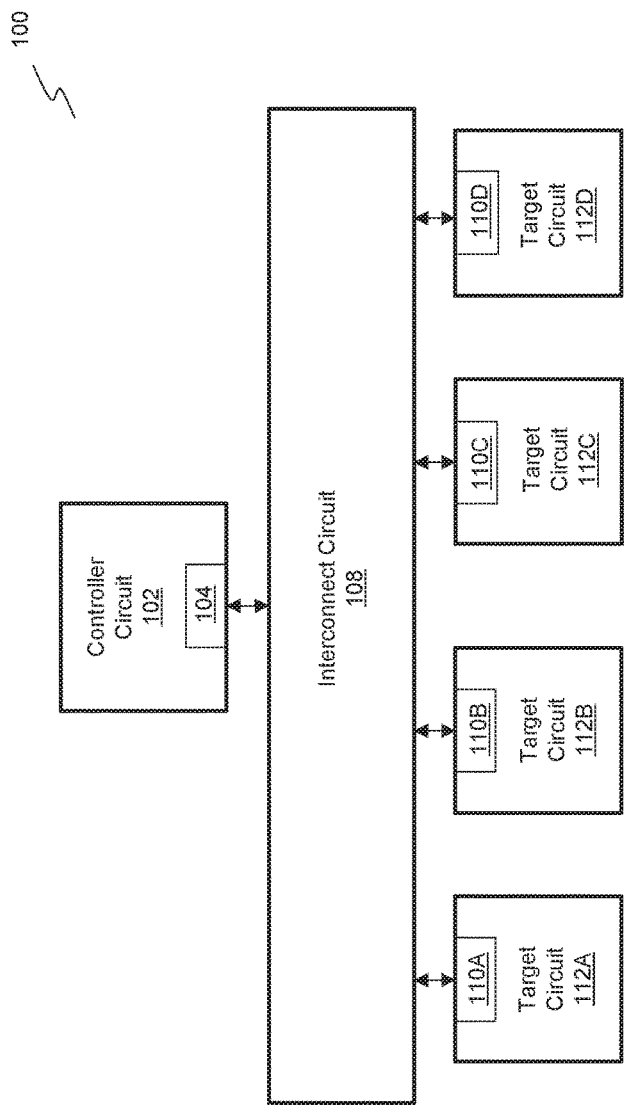
FIG. 1 illustrates an exemplary circuit system with a controller circuit coupled to multiple target circuits in accordance with an embodiment of the present invention.

FIG. 1 illustrates a circuit system with a controller circuit coupled to multiple target circuits in accordance with one embodiment of the present invention. Circuit system 100 includes controller circuit 102, interconnect circuit 108, and target circuits 112A, 112B, 112C, and 112D. In one embodiment, circuit system 100 may be an electronic system, such as, a telecommunication system, a computer system or an automotive system. For example circuit system 100 may be implemented to process a video image for a computer monitor or to process keystroke signals from a keyboard within a computer system. In another example, circuit system 100 may be used to process data received from a user and to transmit the data to another user in a network circuit within a telecommunication system.

Circuit system 100 may be implemented entirely on a programmable logic device (PLD) circuit as described below in FIG. 2. In one embodiment, controller circuit 102, target circuits 112A, 112B, 112C, and 112D and interconnect circuit 108 may be formed by configuring programmable logic elements within the PLD circuit. Alternatively, circuit system 100 may be implemented on a printed circuit board (PCB) whereby controller circuit 102 and target circuits 112A, 112B, 112C, and 112D are discrete circuit devices. In one embodiment, controller circuit 102 and target circuits 112A, 112B, 112C, and 112D may be application specific integrated circuit (ASIC) devices or application specific standard product (ASSP) devices.

Referring still to FIG. 1, controller circuit 102 may be a central processing unit (CPU), a microprocessor, a floating point coprocessor, a graphics coprocessor, a hardware controller, a microcontroller, a PLD configured as a controller, a network controller, or other processing unit. Target circuits 112A, 112B, 112C, and 112D may include a variety of circuits (e.g., a memory circuit, a digital signal processing circuit, an analog-to-digital (A2D) converter, or a digital-to-analog (D2A) converter).

Even though a single controller circuit 102 and four target circuits 112A-112D are shown in FIG. 1, it should be appreciated that the number of controller circuits 102 and target circuits 112A, 112B, 112C, and 112D may vary depending on the design requirements of a particular circuit system 100. For example, in a quad-core processor system, there may be four processor circuits (i.e., four controller circuits) within the circuit system. In a circuit system with several peripherals, there may be a large number of peripheral circuits (i.e., target circuits) coupled to a processor circuit (i.e., a controller circuit). One example of a circuit system with several peripherals is a telecommunication system. Alternatively, within a simple circuit system, the number of target circuits coupled to a controller circuit may be small. For example, a memory controller circuit system is a simple circuit system whereby only one memory circuit (i.e., only one target circuit) is coupled to a memory controller circuit (i.e., a controller circuit).

In the embodiment of FIG. 1, controller circuit 102 may be coupled to target circuits 112A, 112B, 112C, and 112D through interconnect circuit 108. Controller circuit 102 and target circuits 112A, 112B, 112C, and 112D further include interface circuit 104, 110A, 110B, 110C, and 110D, respectively. Interface circuit 104 may include circuitry to receive signals that are transmitted to controller circuit 102 and to transmit signals out of controller circuit 102. Additionally, interface circuit 110A, 110B, 110C, and 110D may include circuitry to transmit signals out of the respective target circuits 112A, 112B, 112C, and 112D or to receive signals at the respective target circuits 112A, 112B, 112C, and 112D. In one exemplary embodiment, interface circuit 104, 110A, 110B, 110C, and 110D may be input-output (IC) circuits.

A command signal that is generated by controller circuit 102 may be transmitted to one of target circuits 112A, 112B, 112C, and 112D through interface circuit 104, interconnect circuit 108 and a corresponding interface circuits 110A, 110B, 110C, or 110D. Subsequently, a response from either of the target circuits 112A, 112B, 112C, or 112D may be transmitted to controller circuit 102 through its corresponding interface circuit 110A, 110B, 110C, or 110D, interconnect circuit 108 and interface circuit 104.

The command signals being transmitted between controller circuit 102 and target circuits 112A, 112B, 112C, and 112D may vary depending on the type of circuits used as controller circuit 102 and target circuits 112A, 112B, 112C, and 112D. In one scenario, controller circuit 102 may be a processor unit and one of the respective target circuits 112A, 112B, 112C, or 112D may be a memory unit. In such a scenario, a command signal being transmitted between controller circuit 102 and the memory unit may be a read command signal or a write command signal. In this instance, a read command signal may command the memory unit to transmit a stored data within the memory unit to controller circuit 102 while a write command signal may command the memory unit to store data received from controller circuit 102.

In one embodiment, the command signal may be an 8-bit signal, a 16-bit signal, a 24-bit, or a 32-bit signal. The command signal may be transmitted serially or in parallel through the interconnect circuit 108. Similarly, the response signal from either target circuits 112A, 112B, 112C, or 112D may be an 8-bit signal, a 16-bit signal or a 32-bit signal. The response signal may also be transmitted serially or in parallel through interconnect circuit 108 from one of target circuits 112A, 112B, 112C, and 112D to controller circuit 102. Hence, in one embodiment, an 8-bit command signal may require at least 8 clock cycles in order for it to be transmitted through interconnect circuit 108.

In an embodiment, the interconnect circuit 108 may be a simultaneous multiple controller interconnection fabric configured to receive multiple instructions from a plurality of controllers simultaneously. Still referring to FIG. 1, interconnect circuit 108 may include multiple circuits and signal pathways, details of which are described below with reference to FIG. 2. For example, interconnect circuit 108 may include multiple signal pathways for transferring command signals between controller circuit 102 and target circuits 112A, 112B, 112C, and 112D. A command signal being transmitted through a single signal pathway may be referred to as a single-threaded command signal while multiple command signals being transmitted through multiple signal pathways may be referred to as multithreaded command signals.

In one embodiment, interconnect circuit 108 may receive consecutive command signals from controller circuit 102 without halting or interrupting the operation of controller circuit 102. For example, if controller circuit 102 is a microprocessor that sequentially executes instructions, halting the microprocessor will put the microprocessor in an idle state until an external event makes the microprocessor resume its normal operation. In one embodiment, the consecutive command signals may be associated with different target circuits (e.g., a first command signal for target circuit 112A and a second command signal for target circuit 112B).

Figure 2:
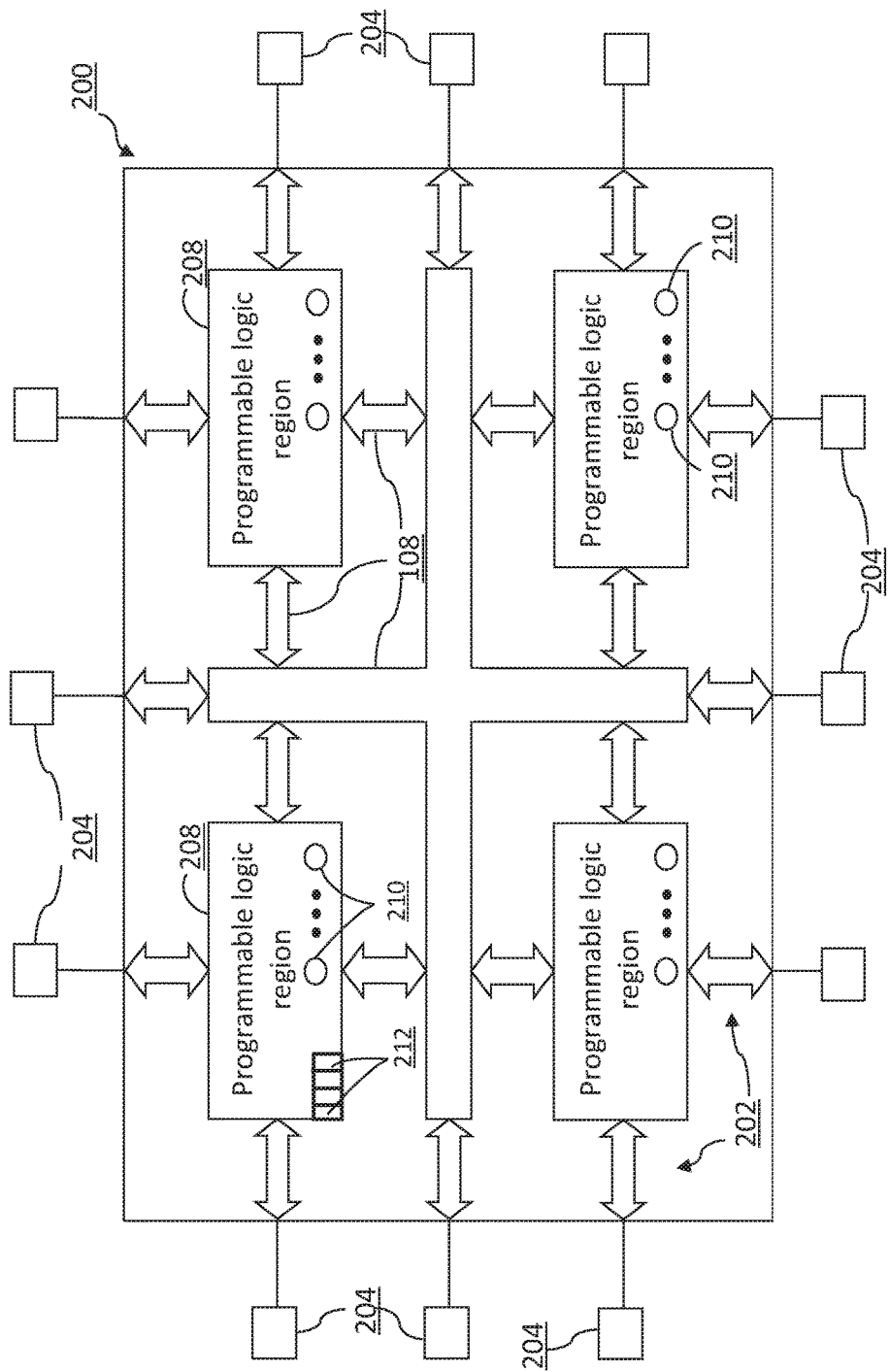
FIG. 2 illustrates an example programmable integrated circuit in accordance with an embodiment of the present invention.

FIG. 2 illustrates a programmable integrated circuit in accordance with an embodiment of the present invention. In FIG. 2, a programmable logic device circuit 200 may include input-output circuitry 202 for driving signals of device circuit 200 and for receiving signals from other devices via input-output pins 204. Interconnect circuit 108 may comprise resources such as global and local vertical and horizontal conductive lines and buses may be used to route signals on device circuit 200. An interconnect circuit 108 includes conductive lines and programmable connections between respective conductive lines and are therefore sometimes referred to as programmable interconnects.

Programmable device 200 may include programmable logic 208 that can be configured to perform a custom logic function. Programmable logic 208 may include combinational and sequential logic circuitry. The interconnect circuit 108 may be considered to be a type of programmable logic 208.

Device 200 may also contain programmable memory elements 210. Memory elements 210 can be loaded with configuration data (also called programming data) using pins 204 and input-output circuitry 202. Once loaded, the memory elements may each provide a corresponding static control signal that controls the operation of an associated logic component in programmable logic 208. In a typical scenario, the outputs of the loaded memory elements 210 are applied to the gates of metal-oxide-semiconductor transistors in programmable logic 208 to turn certain transistors on or off and thereby configure the logic in programmable logic 208 and routing paths. Programmable logic circuit elements that may be controlled in this way include pass transistors, parts of multiplexers (e.g., multiplexers used for forming routing paths in interconnect circuit 108), look-up tables, logic arrays, various logic gates, etc.

Memory elements 210 may be implemented using any suitable volatile and/or non-volatile memory structures such as random-access-memory (RAM) cells, fuses, antifuses, programmable read-only-memory memory cells, mask-programmed and laser-programmed structures, resistive memory structures, combinations of these structures, etc. Because memory elements 210 are loaded with configuration data during programming, memory elements 210 are sometimes referred to as configuration memory, configuration RAM (CRAM), or programmable memory elements.

The circuitry of device 200 may be organized using any suitable architecture. As an example, the logic of device 200 may be organized in a series of rows and columns of larger programmable logic regions each of which contains multiple smaller logic regions. The smaller regions may be, for example, regions of logic that are sometimes referred to as logic elements (LEs), each containing a look-up table (LUT), one or more registers, and programmable multiplexer circuitry. The smaller regions may also be, for example, regions of logic that are sometimes referred to as adaptive logic modules (ALMs). Each adaptive logic module may include a pair of adders, a pair of associated registers and a look-up table or other block of shared combinational logic (as an example). The larger regions may be, for example, logic array blocks (LABs) containing multiple logic elements or multiple ALMs. In the example of FIG. 2, illustrative logic regions 212 (which may be, for example, LEs or ALMs) are shown in one of the larger regions of programmable logic 208 in FIG. 2 (which may be, for example, a logic array block). In a typical programmable logic device 200, there may be hundreds or thousands of smaller logic regions 212. The logic regions 212 that are shown in FIG. 2 are merely illustrative.

During device programming, configuration data is loaded into device 200 that configures the programmable logic regions 212 and programmable logic regions 208 so that their logic resources perform desired logic functions on their inputs and produce desired output signals. For example, CRAM cells are loaded with appropriate configuration data bits to configure adders and other circuits on device 200 to implement desired custom logic designs.

The resources of device 200 such as programmable logic 208 may be interconnected by interconnect circuit 108. Interconnect circuit 108 generally include vertical and horizontal conductors. These conductors may include global conductive lines that span substantially all of device 200, fractional lines such as half-lines or quarter lines that span part of device 200, staggered lines of a particular length (e.g., sufficient to interconnect several logic array blocks or other such logic areas), smaller local lines, or any other suitable interconnection resource arrangement. If desired, the logic of device 200 may be arranged in more levels or layers in which multiple large regions are interconnected to form still larger portions of logic. Still other device arrangements may use logic that is not arranged in rows and columns.

In addition to the relatively large blocks of programmable logic that are shown in FIG. 2, the device 200 generally also includes some programmable logic associated with the programmable interconnects, memory, and input-output circuitry on device 200. For example, input-output circuitry 202 may contain programmable input and output buffers. Interconnect circuit 108 may be programmed to route signals to a desired destination.

Figure 3:
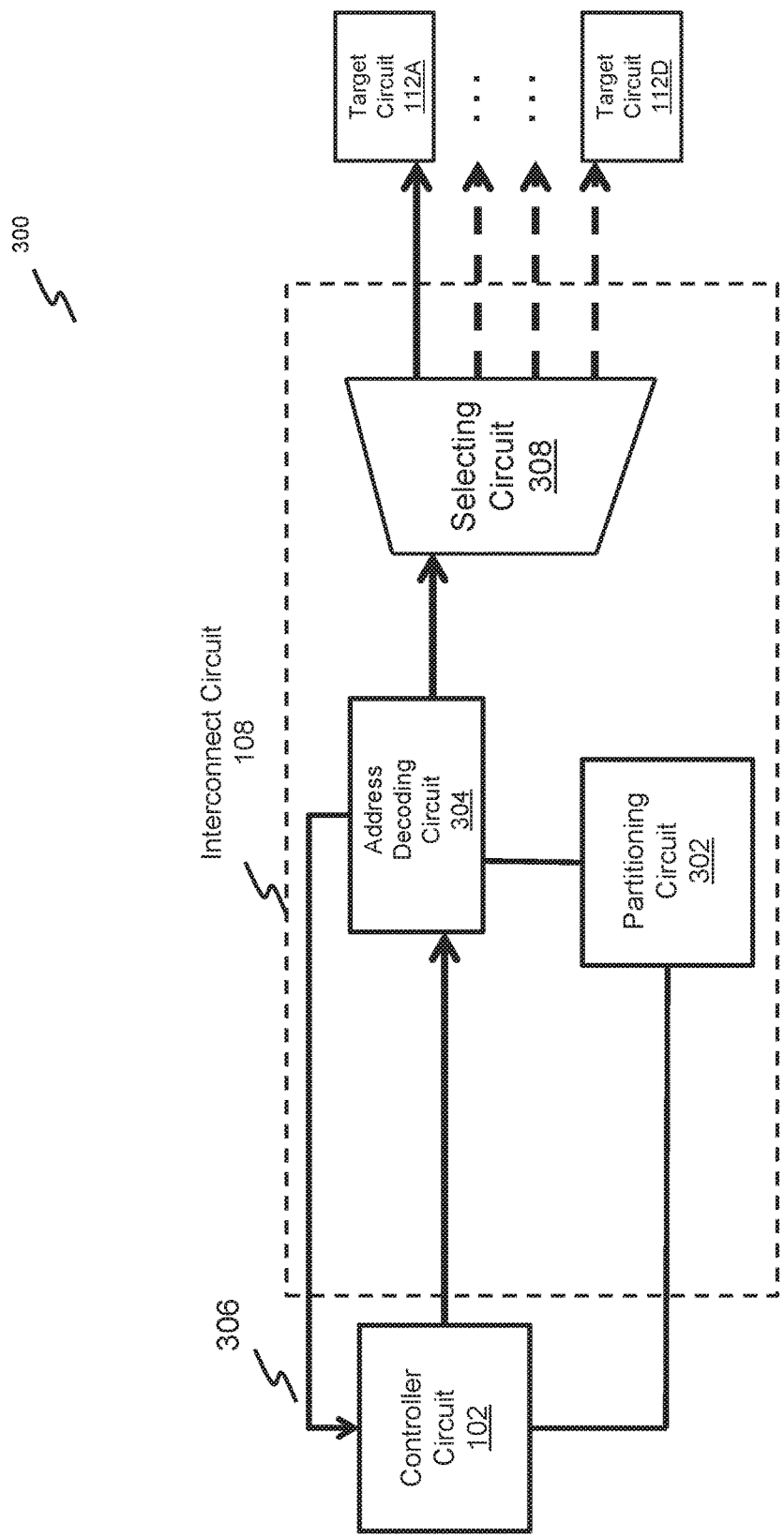
FIG. 3 illustrates an exemplary addressing circuit in accordance with an embodiment of the present invention.

FIG. 3 illustrates an example addressing circuit in in accordance with an embodiment of the present invention. For the purposes of illustrating clear examples, addressing circuit 300 of FIG. 3 will be discussed in connection with the circuit system 100 of FIG. 1 and PLD circuit 200 of FIG. 2.

Referring to FIG. 3, partitioning circuit 302 partitions a set of encoded addresses in two subsets of encoded addresses according to a partition definition. In the following description, all references to "sending" or "receiving" in connection with controller circuit 102 and target circuits 112A, 112B, 112C, and 112D may refer to operations connected with interface circuits 104, 110A, 110B, 110C, and 110D respectively. Controller circuit 102 sends a first encoded address from the set of encoded addresses for decoding to address decoding circuit 304. Address decoding circuit 304 determines whether the first or second subset of encoded addresses contains the first encoded address. If address decoding circuit 304 determines that the first subset contains the first encoded address then the first encoded address is decoded in a first duration. If address decoding circuit 304 determines that the second subset contains the first encoded address, then the first encoded address is decoded in a second duration that is longer than the first duration while simultaneously, halt signal 306 is sent to controller circuit 102 by address decoding circuit 304 for the entirety of the second duration. A target select signal is generated as a result of decoding the first encoded address. The selecting circuit 308 then selects the appropriate target circuit based on the target select signal.

Referring again to FIG. 3, partitioning circuit 302 selects a partition definition. In an embodiment, controller circuit 102 controls the partitioning operation. In another embodiment, address decoding circuit 304 controls the partitioning operation itself. In an embodiment, partitioning circuit 302 is implemented in interconnect circuit 108. In another embodiment, partitioning circuit 302 is implemented in controller circuit 102. In yet another embodiment, partitioning circuit 302 is implemented in interface unit 104 of the controller circuit 102.

A partition definition may refer to the rule, scheme, or basis for dividing the set of encoded addresses into two distinct subsets of encoded addresses with no overlap based on an analysis of address decoding transactions in circuit system 100. In an embodiment, circuit system 100 is analyzed and a partition definition is generated by assuming that the frequency of accessing target circuits is proportional to the size of memory locations addressed by the encoded addresses associated with the target circuits. In another embodiment, the partition definition may be determined by a user based on their expertise in understanding the dynamic address decoding transactions in the circuit system 100. In an embodiment, the partition definition is generated by analyzing a simulation of address decoding transactions in circuit system 100. In another embodiment, the partition definition is based on an analysis of the results of in-system monitoring of address decoding transactions over a given duration in circuit system 100.

Thus, the partition definition reflects a model of address decoding transactions in circuit system 100. In an embodiment, the partition definition is based on analyzing the frequency of access to one or more of target circuits 112A, 112B, 112C, and 112D by controller circuit 102. Therefore, encoded addresses of target circuits that are accessed together more frequently are grouped in the first subset or high frequency subset of encoded addresses with the rest being grouped in the second subset or low frequency subset of encoded addresses. For example, it could be determined that 75% of the time when target circuit 112A is accessed by controller circuit 102 the next access request by controller circuit 102 will be to access target circuit 112B. In that case, address decoding circuit 304 can optimizes transaction latency for target circuit 112B following an access request for target circuit 112A thereby improving overall throughput for circuit system 100. In still another embodiment, the partition definition is modeled as a Markov chain or a hidden Markov model based on analyzing the probabilities of accessing each target circuit after receiving access requests from controller circuit 102 to access all other target circuits.

In an embodiment, partitioning circuit 302 stores a plurality of pre-determined partition definitions. In an embodiment, partitioning circuit 302 chooses the appropriate partition definition from the plurality of pre-determined partition definitions at run-time based on a run-time analysis of circuit system 100. In another embodiment, the partitioning circuit 302 automatically determines a new partition definition at run-time based on previous analysis of circuit system 100.

After determining the appropriate partition definition, partitioning circuit 302 partitions the set of encoded addresses in two subsets according to the partition definition. According to the partition definition, since encoded addresses in the first subset are accessed together or more frequently, they are decoded in a shorter duration than the encoded addresses in the second subset. For example, encoded addresses in the first subset may be decoded in one clock cycle whereas encoded addresses in the second subset may take at least two clock cycles to decode. In complicated computing systems, such as those employing an interconnect architecture, larger address widths, or more addressable target circuits address decoding is more complex and may become a critical path vis-à-vis the operation of the circuit. Pipelining the decoding of all addresses over multiple cycles may increase the request frequency (allow more decode request) but at the cost of increasing transaction latency (or delay) for each address decoding transaction. Thus, partitioning the addresses allows the high frequency or high priority addresses (i.e. addresses in the first subset) to be decoded quickly (i.e. in one clock cycle). Similarly, the addresses in low frequency or low priority (i.e. second subset) are decoded over multiple clock cycles. Furthermore, certain addresses (for example those that do not address any slave) are computationally hard to decode and therefore, in order to optimize overall address decoding operations, are decoded over multiple clock cycles.

Referring again to FIG. 3, controller circuit 102 is coupled to the address decoding circuit 304. In an embodiment, controller circuit 102 controls the operations of address decoding circuit 304. In an embodiment, controller circuit is coupled to and controls the operations of partitioning circuit 302. Controller circuit 102 sends a first encoded address from the set of encoded addresses to address decoding circuit 304. In an embodiment, address decoding circuit 304 is coupled to controller circuit 102, partitioning circuit 302, and selecting circuit 308. In an embodiment, a separate address decoding circuit 304 may be formed for each controller in a multi-controller circuit system 100 implemented on PLD circuit 200.

In an embodiment, the address decoding circuit 304 receives the first encoded address for decoding from controller circuit 102. Address decoding circuit 304 then determines whether the encoded address belongs to the first subset or the second subset of the set of encoded addresses. In an embodiment, if the address decoding circuit 304 determines that the first encoded address belongs to the first subset, then the address decoding circuit 304 decodes the first encoded address in a first duration. For example, address decoding circuit 304 may determine that the first encoded address belongs to a high priority subset and may be decoded in one clock cycle.

In an embodiment, decoding the first encoded address further comprises generating a chipselect or a target select signal by address decoding circuit 304 and a sending the target select signal to selecting circuit 308. In an embodiment, the target select signal indicates the target circuit associated with the first encoded address. In an embodiment, selecting circuit 308 comprises a de-multiplexer that asserts an output line based on the target select signal and allows controller circuit 102 to access the target circuit. In another embodiment, selecting circuit 308 comprises a crossbar switch that allows controller circuit 102 to access the target circuit based on the target select signal generated by address decoding circuit 304.

In an embodiment, if address decoding circuit 304 determines that the first encoded address belongs to the second subset then address decoding circuit 304 decodes the first encoded address in a second duration. In an embodiment, the second duration is longer than the first duration. For example, the first encoded address may belong to the low priority or low frequency subset. Addresses in the second subset are usually computationally complex and therefore take multiple clock cycles to decode. Thus, address decoding circuit 304 may take more than one clock cycle to decode the first encoded address if the first encoded address is in the low frequency subset. Simultaneously, address decoding circuit 304 sends a halt signal via halt-signal line 306 back to controller circuit 102. The halt signal indicates to controller circuit 102 to stop the transmission of a second encoded address while the first encoded address is being decoded. In an embodiment, the halt signal is sent to controller circuit 102 after each clock cycle while the first encoded address is being decoded. In another embodiment, the halt signal is sent at the start of decoding of the first encoded address. For example if the first encoded address will be decoded in three clock cycles, halt signal is sent to controller circuit 102 at the beginning of the first clock cycle. In this example, halt signal will also include instructions that direct controller circuit 102 to wait or halt operation for the next three clock cycles. In an embodiment, the format of halt signal 306 is determined by the implementation platform for circuit system 100.

Figure 4:
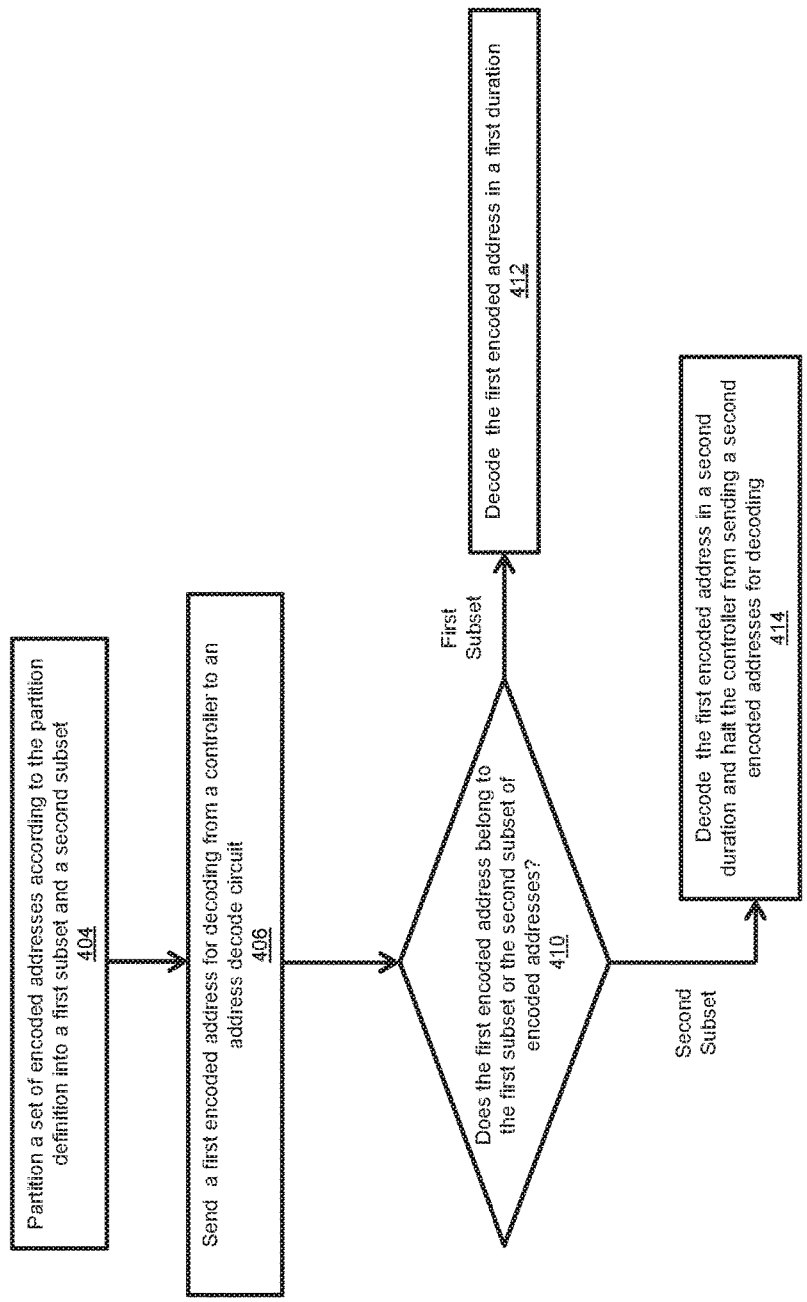
FIG. 4 illustrates an exemplary method of operating an addressing circuit in accordance with an embodiment of the present invention.

FIG. 4 illustrates a method of operating addressing circuit 300 in accordance with an embodiment of the present invention. For the purposes of illustrating clear examples, the method of operating depicted in FIG. 4 is described in connection with addressing circuit 300 of FIG. 3. However, a same or substantially similar process can be utilized in other implementations.

At block 404, partitioning circuit 302 partitions a set of encoded addresses into a first subset and a second subset of encoded addresses. For example, an address map of a circuit system with a 24-bit address space prior to partitioning by partitioning circuit 302 is shown below:

| Encoded Address | Target Circuit |
|---|---|
| 0-0x7FFF | memory1 |
| 0x8000-0xFFFF | ethernet0 Control State Register (CSR) |
| 0x10000-0x1000F | timer CSR |
| 0x10010-0xFFFFF | no target selected |
| 0x100000-0x1000FF | peripheral bridge |

Partitioning circuit 302, based on the techniques described above, develops a partition definition and the address map is partitioned according to the partition definition. For example, the analysis may indicate that the target circuits memory1 and ethernet0 are accessed most frequently. Therefore, a partition definition is developed to facilitate that access pattern or improve transactional latency for an exemplary circuit system 100 that may implement such an access pattern. Furthermore, the partition definition may take into account that decoding encoded addresses that are not associated with a target circuit may be a computationally intensive task. Thus, following partitioning by partitioning circuit 302 the address map may be as shown below:

| Encoded Address | Target Circuit | Partition Subset | Decoded Target Circuit ID |
|---|---|---|---|
| 0-0x7FFF | memory1 | Subset 1 | 00001 |
| 0x8000-0xFFFF | ethernet0 CSR | Subset 1 | 00010 |
| 0x10000-0x1000F | timer CSR | Subset 2 | 00100 |
| 0x10010-0xFFFF | no target selected | Subset 2 | 10000 |
| 0x100000-0x1000FF | peripheral bridge | Subset 2 | 01000 |

The decoded target circuit IDs are the output of decoding operation performed on the encoded addresses by address decoding circuit 304, are shown here for explanatory purposes only, and may not be included in the address map of circuit system 100. The encoded addresses in Subset 1 are decoded in one clock cycle and the encoded addresses in Subset 2 are decoded in at least two clock cycles according to the partition definition. Some encoded address ranges, such as the address range 0x10010-0xFFFF may be unassigned, and therefore may not correspond to any target devices.

Encoded addresses in Subset 1 may be decoded in one clock cycle (i.e., a shorter duration than is required to decode addresses in Subset 2) due to a partial reconfiguration of the address decoding circuit 304 that implements specialized address decoding circuitry for encoded addresses of Subset 1 on programmable logic circuitry in address decoding circuit 304. Addresses in Subset 2 may be decoded using generic address decoding circuitry implemented in address decoding circuit 304.

Partial reconfiguration of the address decoding circuit 304 to implement specialized address decoding circuitry for a given subset of encoded address may enable the addresses in the given subset to be decoded at a faster rate (i.e., in a shorter duration) relative to addresses that are decoded using generic address decoding circuitry. As the partition definitions for the address decoding circuit 304 are changed based on the aforementioned factors (i.e., based on user expertise, monitoring/analysis of the frequency and type of address decoding transactions, etc.) by the partitioning circuit 302, programmable logic circuitry in the address decoding circuit 304 may be correspondingly partially reconfigured to implement specialized address decoding circuitry for addresses in a high-priority subset of addresses in each new partition definition.

At block 406, controller circuit 102 sends a first encoded address from the range of encoded addresses to address decoding circuit 304. For example, based on the address map discussed above the controller circuit may send a request to access memory1. In an embodiment, the first encoded address is accompanied by instructions from controller circuit 102 to read from, write to, or modify the contents of the target circuit associated with the first encoded address.

At block 410, address decoding circuit 304 determines whether the first encoded address is contained in the first or second subset of encoded addresses. In an embodiment, address decoding circuit 304 looks up the first encoded address in the address map of circuit system 100. In the example above, the address decoding circuit looks up memory1 in the post-partition system address map in the above example. In another embodiment, address decoding circuit 304 determines whether the first subset or second subset of encoded addresses contains the first encoded address according to a marker accompanying the first encoded address. In an embodiment, the marker may be a bit configuration indicating the subset of the first encoded address. For example, a bit configuration of '0' may indicate the first subset and a bit configuration of '1' may indicate the second subset.

If address decoding circuit 304 determines that the first subset contains the first encoded address then the process moves to block 412. At block 412, the first encoded address is decoded in a first duration to obtain the first target select signal or first chipselect signal. In an embodiment, decoding the first encoded address comprises executing the address decode logic in address decoding circuit 304 to determine the target select signal corresponding to the target circuit, for example target circuit 112A, associated with the first encoded address. In an embodiment, the first duration may be measured in discrete clock cycles of a processor in circuit system 100.

In an embodiment, decoding the first encoded address may further comprise forwarding a target select signal generated based to selecting circuit 308. The target select signal may be a binary bit pattern that instructs selecting circuit 308 to allow access to a target circuit associated with the first encoded address by asserting the appropriate output line of selecting circuit 308. In an embodiment, selecting circuit 308 then concludes the address decoding transaction by allowing controller circuit 102 to access the target circuit selected based on the target select or chipselect signal. Continuing the example from above, address decoding circuit 304 determines that the encoded address associated with memory1 belongs to Subset 1. Since encoded addresses in Subset 1 are capable of being decoded in one clock cycle (by virtue of programmable logic circuitry in address decoding circuit 304 being partially reconfigured to implement specialized address decoding circuitry for addresses in Subset 1 as mentioned above in connection with step 404), address decode circuit decodes the encoded address associated with memory1 in one clock cycle. The target select signal for memory1 (which is the target circuit ID '00001' shown in the post-partition address map above) is then forwarded to selecting circuit 308, which may be a de-multiplexer or a crossbar switch. Selecting circuit 308 allows controller circuit 102 to access memory1.

If address decoding circuit 304 determines that the second subset of encoded addresses contains the first encoded address then the process moves to block 414. At block 414, address decoding circuit 304 decodes the first encoded address in a second duration to obtain the first decoded address and simultaneously sends a halt signal over halt signal line 306 to controller circuit 102. In an embodiment, the second duration may be measured in discrete clock cycles of a processor in circuit system 100. In an embodiment, the halt signal prevents controller circuit 102 from sending additional encoded addresses for decoding for the entirety of second duration. For example, instead of memory1, controller circuit 102 may send a request to address decoder circuit 304 to access the peripheral bridge in the above example. Address decoder circuit 304 looks up peripheral bridge in the post-partitioning system address map illustrated above and determines that the encoded address for peripheral bridge is contained in Subset 2. Since encoded addresses in the second subset are decoded in at least two clock cycles, the address decode circuit decodes the encoded address associated with peripheral bridge in at least two clock cycles. A person skilled in the art will appreciate that the second duration maybe more than two clock cycles depending upon implementation.

One method to decode an encoded address over multiple clock cycles may involve computing intermediate results after each cycle. For example, the address decode logic to decode peripheral bridge in a two clock cycles may compute an intermediate result on the first clock cycle, and then combine that intermediate result with a further result in the second clock cycle to complete the decoding. The logic may only consider half of the address bits in the first cycle, and the other half in the second cycle. Simultaneously, a halt signal is sent to controller circuit 102 from address decoding circuit 304, which halts controller circuit 102 from sending further encoded addresses for decoding to address decoding circuit 304 for two clock cycles. In an embodiment, decoding the first encoded address yields a target select signal associated with the first encoded address. In an embodiment, selecting circuit 308 then concludes the address decoding transaction by allowing controller circuit 102 to access the target circuit selected according to the target select signal.

Figure 5:
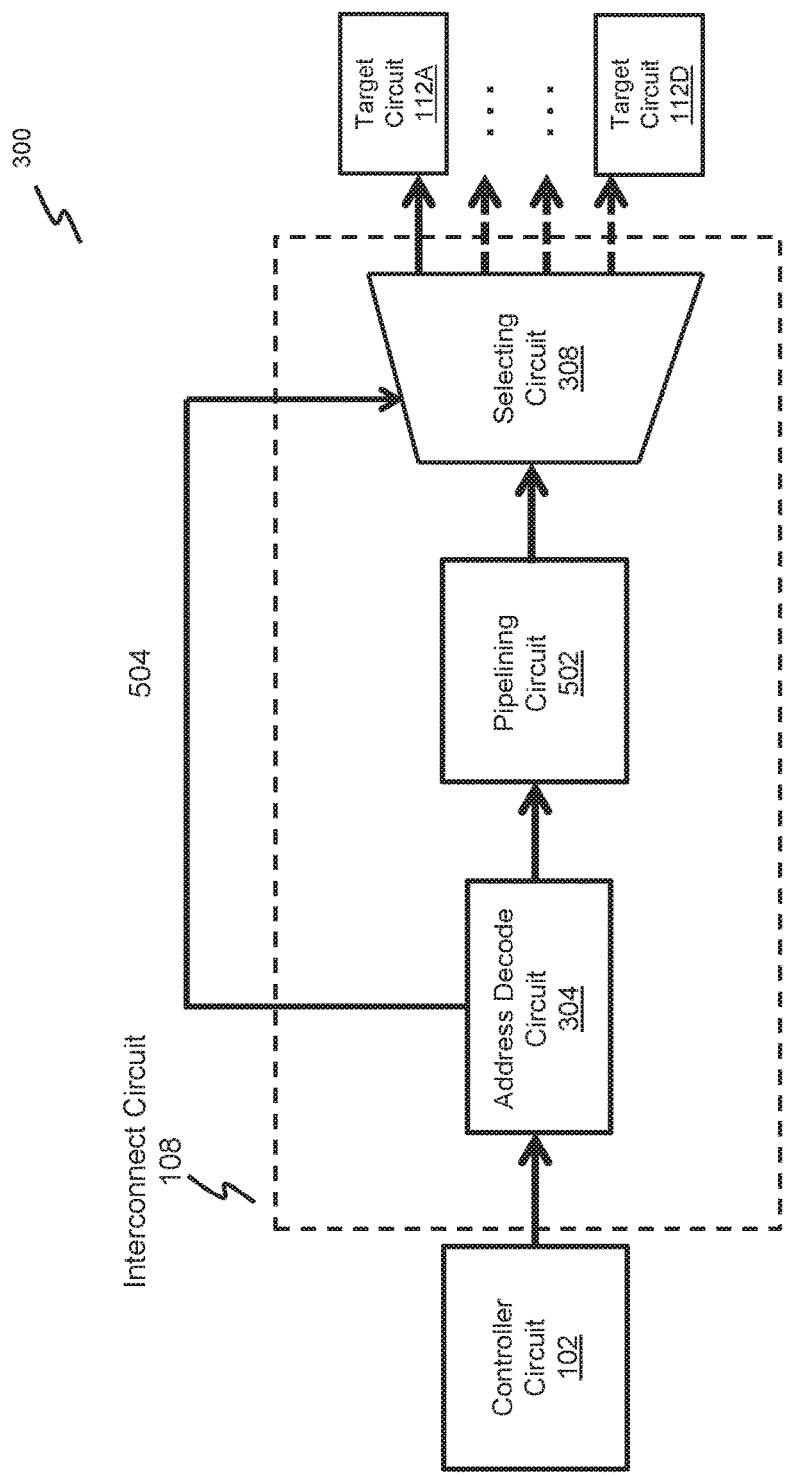
FIG. 5 illustrates an exemplary addressing circuit in accordance with an embodiment of the present invention.

FIG. 5 illustrates another example addressing circuit in accordance with an embodiment of the present invention. For the purposes of illustrating clear examples, addressing circuit 300 of FIG. 5 will be discussed in connection with circuit system 100 of FIG. 1 and PLD circuit 200 of FIG. 2.

Referring to FIG. 5, controller circuit 102 sends a first encoded address from a set of encoded addresses for decoding to address decoding circuit 304. Address decoding circuit 304 generates a select-all signal based on the first encoded address by pipelining the execution of the decode logic function using pipelining circuit 502. In parallel to the generating a select-all signal, address decoding circuit 304 also computes a cancel signal 504 based on the target address that is decoded from the first encoded address as a result of the execution of the decode logic function. Selecting circuit 308 receives the select-all signal from pipelining circuit 502 and cancel signal 504 from address decoding circuit 304. The select-all signal generated by address decoding circuit 304 for selecting circuit 308 selects each target of the set of targets that are accessible using selecting circuit 308. Selecting circuit 308 then selects the appropriate target circuit based on the select-all signal and cancel signal 504.

Referring to FIG. 5, controller circuit 102 is similar to the controller circuit described elsewhere in this disclosure. In an embodiment, controller circuit 102 is coupled to address decoding circuit 304 and sends a first encoded address to address decoding circuit 304 for decoding.

Referring again to FIG. 5, address decoder circuit 304 is similar to the address decode circuit described above. In an embodiment, address decoding circuit 304 is coupled to pipelining circuit 502. Address decoding circuit 304 receives the first encoded address and forwards the first encoded address to pipelining circuit 502 to generate a select-all signal. Simultaneously, address decoding circuit 304 also computes the cancel signal 504 based on the target address that is decoded from the first encoded address after the decode logic function has finished executing. As soon as the cancel signal 504 is generated (at a time after the generation of the select-all signal), the cancel signal 504 may be transmitted/propagated to selecting circuit 308.

Referring again to FIG. 5, pipelining circuit 502 receives the first encoded address from the address decoding circuit 304. Pipelining is used in computing systems to increase their instruction throughput (the number of instructions that can be executed in a unit of time). The basic instruction cycle is broken up into a series of stages called a pipeline. Rather than processing each instruction sequentially (one at a time, finishing one instruction before starting the next), each instruction is split up into a sequence of steps so different steps processing different address requests can be executed concurrently (at the same time) by different stages in the pipeline. In an embodiment, pipelining circuit 502 comprises at least one pipeline register. In an embodiment, pipelining circuit 502 is formed in interconnect circuit 108. In another embodiment, pipelining circuit 502 is implemented in selecting circuit 308. In still another embodiment, pipelining circuit is implemented in address decoding circuit 304. In an embodiment, pipelining circuit 502 pipelines the generating of the select-all signal based on the first encoded address by executing the address decoding logic over multiple durations, multiple intervals, or multiple clock cycles. In another embodiment, the multiple durations are at least two clock cycles of a system clock of circuit system 100. In an embodiment, pipelining circuit 502 forwards the select-all signal to selecting circuit 308.

The select-all signal leverages the ability of address decoding circuit 304 to issue access requests to multiple destinations in a clock cycle and cancel some or all of them on later clock cycles. Thus, there is no additional latency during address decoding as all requests to decode encoded addresses are accepted by address decoding circuit 304 without interrupting the flow of access requests by controller circuit 102. The select-all signal asserts all lines of a selecting circuit 308 thereby selecting all target circuits accessible by selecting circuit 308. Simultaneously, a cancel signal 504 is computed such that cancel signal 504 modifies the select-all signal to select the target circuit associated with the encoded address.

Referring to FIG. 5, cancel signal 504 is propagated from the address decoding circuit 304 to selecting circuit 308. In an embodiment, cancel signal 504 is generated in parallel to generating the select-all signal. In an embodiment, cancel signal 504, when received at the selecting circuit 308, may modify the select-all signal such that only the target associated with the first encoded address is selected by selecting circuit 308. In an embodiment, cancel signal 504 reaches selecting circuit 308 before the select-all signal propagates to all the target circuits accessible by selecting circuit 308 (i.e., before the select-all signal is used to convey the memory access request to all of the target circuits 112A-112D).

Referring now to FIG. 5, selecting circuit 308 is similar to the selecting circuit described above. In an embodiment, selecting circuit 308 comprises a de-multiplexer or a crossbar switch. In an embodiment, selecting circuit 308 accesses a target circuit 112A-112D according to a modified target select signal. The modified target select signal is generated based on the select-all signal and cancel signal 504 thereby completing the address decoding transaction.

Figure 6:
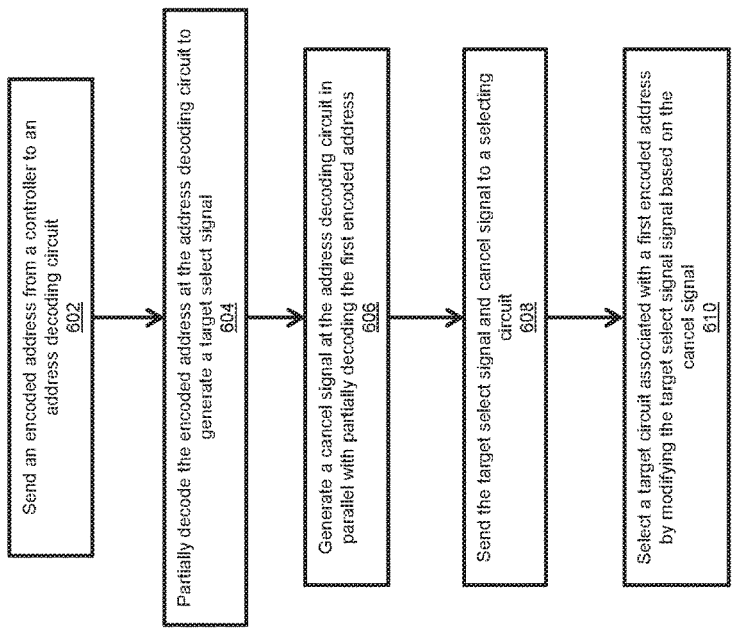
FIG. 6 illustrates an exemplary method of operating an addressing circuit in accordance with an embodiment of the present invention.

FIG. 6 illustrates a method of operating an addressing circuit in accordance with an embodiment of the present invention. For the purposes of illustrating clear examples, the method of operating depicted in FIG. 6 is described in connection with the addressing circuit 300 of FIG. 5. However, a same or substantially similar process can be utilized in other implementations.

At block 602, controller circuit 102 sends a first encoded address from the range of encoded addresses to address decoding circuit 304. For example, based on the address map below the controller circuit may send a request to access ethernet0. In an embodiment, the first encoded address is accompanied by instructions from controller circuit 102 to read from, write to, or modify the contents of the target circuit associated with the encoded address. An exemplary memory map indicating target circuits and associated encoded addresses is shown below. The decoded target circuit IDs are the output of combining the select-all signal and cancel signal 504 at selecting circuit 308, are shown here for explanatory purposes only, and may not be included in the address map of circuit system 100.

| Encoded Address | Target Circuit | Target Circuit IDs |
| --- | --- | --- |
| 0-0x7FFF | memory1 | 00001 |
| 0x8000-0xFFFF | ethernet0 | 00010 |
| 0x10000-0x1000F | timer | 00100 |
| 0x100000-0x1000FF | peripheral bridge | 01000 |

At block 604, address decoding circuit 304 generates a select-all signal. In an embodiment, address decoding circuit 304 may pipeline the generating of the select-all signal by forwarding the first encoded address to pipelining circuit 502. In another embodiment, pipelining circuit 502 may generate a target select signal that selects all targets accessible by selecting circuit 308. Continuing the example above, address decoding circuit 304 will generate a select-all signal for a selecting circuit with access to ethernet0. In this example, the select-all signal may be '11111.'

At block 606, address decoding circuit 304 evaluates cancel signal 504 in parallel with generating a select-all signal. In an embodiment, the cancel signal is evaluated over multiple durations. In another embodiment, the multiple durations may be least two clock cycles of a processor in circuit system 100. In an embodiment, cancel signal 504 is a bit pattern. In an embodiment, cancel signal 504 negates or zeroes out all bits in the select-all signal that do not correlate to the output line of selecting circuit 308 that is associated with the target circuit of the first encoded address. In the example above, since the controller sent the first encoded address associated with ethernet0 which is accessible via the second output line of the selecting circuit, the cancel signal will negate the bits for control lines to all other target circuits and will be '00010.'

At block 608, the select-all signal from the pipelining circuit 502 and cancel signal 504 from the address decoding circuit 304 are sent to selecting circuit 308.

At block 610, selecting circuit 308 selects a target circuit according to cancel signal 504 and the select-all signal. In an embodiment, selecting circuit 308 may access the target circuit associated with the first encoded address by asserting the appropriate output line according to a target select signal that is generated based on the select-all signal and the cancel signal. In an embodiment, cancel signal 504 modifies the select-all signal to select the target associated with the first encoded address and concludes the address decoding transaction. In the example above cancel signal 504 (00010) modifies the select-all signal (11111) and thus the de-multiplexer asserts only the third output line to ethernet0. Thereby, controller accesses ethernet0 and the address decoding transaction is concluded. A person skilled in the art will appreciate that the bit patterns for cancel signals and target select signals described in the examples above are only meant for explanatory purposes and other bit patterns may be used in other implementations.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction. Any definitions expressly set forth herein for terms contained in such claims shall govern the meaning of such terms as used in the claims.

What is claimed is:

1. A method of operating an addressing circuit comprising:
   partitioning, using an address partitioning circuit, a set of encoded addresses into non-overlapping first and second subsets of encoded addresses;
   receiving, using an address decoding circuit, a first encoded address;
   in response to identifying that the second subset of encoded addresses contains the first encoded address, using the address decoding circuit, asserting a halt signal using the address decoding circuit;
   decoding, using the address decoding circuit, the first encoded address;
   in response to decoding the first encoded address, de-asserting, using the address decode circuit, the halt signal; and
   in response to de-asserting the halt signal, receiving, using the address decoding circuit, a second encoded address.

2. The method as defined in claim 1 further comprising:
   in response to identifying, using the address decoding circuit, that the first subset of encoded addresses contains the second encoded address, decoding, using the address decoding circuit, the second encoded address; and
   in response to decoding the second encoded address, receiving, using the address decoding circuit, a third encoded address.

3. The method as defined in claim 2, wherein decoding the first encoded address comprises:
   decoding, using the address decoding circuit, the first encoded address in a first duration.

4. The method as defined in claim 3, wherein decoding the second encoded address comprises:
   decoding, using the address decoding circuit, the second encoded address in a second duration.

5. The method as defined in claim 4, wherein the first duration is longer than the second duration.

6. The method as defined in claim 1, wherein the halt signal disables a controller circuit from sending the second encoded address to the address decoding circuit.

7. The method as defined in claim 1, wherein partitioning the set of encoded addresses comprises:
   generating a new partition model, using the address partitioning circuit, for the set of encoded addresses in response to a change in frequency of access to a set of target circuits associated with the set of encoded addresses from the controller circuit; and
   partitioning, using the address partitioning circuit, the set of encoded addresses into a first subset and a second subset of encoded addresses based on the new partition model, wherein the first subset comprises high-frequency access encoded addresses and the second subset comprises low-frequency access encoded addresses.

8. The method as defined in claim 1, wherein partitioning the set of encoded addresses comprises:
   selecting, using the address partitioning circuit, a pre-determined partition model from a set of pre-determined partition models; and
   dividing, using the address partitioning circuit, the set of encoded addresses into the first and the second subsets of encoded addresses according to the pre-determined partition model.

9. The method as defined in claim 8, wherein the pre-determined partition model is selected by a user according to a set of criteria determined by the user.

10. The method as defined in claim 8, wherein the pre-determined partition model is selected automatically by the address partitioning circuit according to change in access pattern to the set of target circuits by the controller circuit.

11. The method as defined in claim 10 further comprising:
    generating, using the address partition circuit, a pre-determined partition model based on identifying a statistical trend according to frequency of access to each target circuit in the set of target circuits by the controller circuit.

12. The method as defined in claim 11, wherein the statistical trend comprises at least one of a Markov chain, a hidden Markov model, and a frequency distribution.

13. The method as defined in claim 1, wherein decoding the first encoded address further comprises:
    generating, using the address decoding circuit, a target select signal, wherein the target select signal indicates a first target address associated with the first encoded address;
    sending, using the address decoding circuit, the target select signal to a selecting circuit; and
    accessing, using the selecting circuit, a first target circuit corresponding to the first target address.

14. A processing system, comprising:
    an encoded address partitioning component that partitions a set of encoded addresses into a first and a second subset of encoded addresses;
    a controller component that sends a first encoded address of the range of encoded addresses to access a first target component through an interconnection component; and
    a decode component that receives the first encoded address, wherein the decode component:
      asserts a halt signal to the controller component in response to identifying that the first encoded address belongs to the second subset of encoded addresses, decodes the first encoded address, de-asserts a halt signal to the controller component in response to decoding the first encoded address, and receives a second encoded address from the controller component in response to de-asserting the halt signal.

15. The processing system as defined in claim 14, wherein the interconnection component is a simultaneous multiple controller interconnection fabric.

16. The processing system as defined in claim 14, wherein the first target component and second target component comprise memory components and peripherals.

17. The processing system as defined in claim 14, wherein the second subset of encoded addresses comprises an unassigned encoded address.

18. A method of operating an addressing circuit comprising:
- receiving, using an address decoding circuit, a first encoded address of a range of encoded addresses from a controller;
- generating, using a pipelining circuit, a select-all signal, wherein the select-all signal is configured to select each target of a set of target circuits accessible using a selecting circuit;
- computing, using the address decoding circuit, a cancel signal, wherein the cancel signal is evaluated in parallel with generating the select-all signal;
- sending, using the address decoding circuit, the select-all signal and the cancel signal to the selecting circuit;
- determining, using the selecting circuit, a first target address based on the select-all signal and the cancel signal; and
- accessing, using the selecting circuit, a first target associated with the first target address.

19. The method as defined in claim 18, wherein the cancel signal modifies the select-all signal to select the first target.

20. The method as defined in claim 18, wherein the selecting circuit comprises at least one of a de-multiplexer and a crossbar switch.

* * * * *